United States Patent
Frescas et al.

(10) Patent No.: US 10,061,386 B2
(45) Date of Patent: Aug. 28, 2018

(54) INTEGRATED PIEZOELECTRIC CANTILEVER ACTUATOR AND TRANSISTOR FOR TOUCH INPUT AND HAPTIC FEEDBACK APPLICATIONS

(71) Applicant: SABIC Global Technologies B.V., Bergen op Zoom (NL)

(72) Inventors: Jesus Alfonso Caraveo Frescas, Thuwal (SA); Ibrahim Al-Howaish, Thuwal (SA); Mahmoud M. Almadhoun, Thuwal (SA); Redha Bella, Thuwal (SA)

(73) Assignee: SABIC Global Technologies B.V., Bergen op Zoom (NL)

( * ) Notice: Subject to any disclaimer, the term of this patent is extended or adjusted under 35 U.S.C. 154(b) by 77 days.

(21) Appl. No.: 15/303,855

(22) PCT Filed: Jun. 3, 2016

(86) PCT No.: PCT/IB2016/053279
§ 371 (c)(1),
(2) Date: Oct. 13, 2016

(87) PCT Pub. No.: WO2016/207751
PCT Pub. Date: Dec. 29, 2016

(65) Prior Publication Data
US 2018/0120938 A1    May 3, 2018

Related U.S. Application Data

(60) Provisional application No. 62/185,506, filed on Jun. 26, 2015.

(51) Int. Cl.
*H01L 41/09* (2006.01)
*G06F 3/01* (2006.01)
(Continued)

(52) U.S. Cl.
CPC ............ *G06F 3/016* (2013.01); *G06F 3/0414* (2013.01); *H01L 27/20* (2013.01); *H01L 41/094* (2013.01); *H01L 41/1136* (2013.01)

(58) Field of Classification Search
None
See application file for complete search history.

(56) References Cited

U.S. PATENT DOCUMENTS 4,480,488 A    11/1984  Read et al. ................. 73/862.68
4,894,698 A     1/1990  Hijikigawa et al. .......... 257/254
(Continued)

FOREIGN PATENT DOCUMENTS

CN    104508829 A    4/2015
EP      0087264 A2    8/1983
(Continued)

OTHER PUBLICATIONS

First Office Action for CN201680000914.5, dated Aug. 2, 2017.
(Continued)

*Primary Examiner* — Thomas Dougherty
(74) *Attorney, Agent, or Firm* — Norton Rose Fulbright US LLP

(57) ABSTRACT

User feedback may be generated and user input received through a single semiconductor component integrated into the electronic device. The single semiconductor component may include a piezoelectric cantilever actuator integrated with a transistor, such as a thin-film transistor, such that the actuator is electrically isolated from the transistor but mechanically attached to the transistor. One manner of integration is to extend a piezoelectric thin film of the actuator into a gate electrode stack of the transistor. The cantilever actuator may be controlled to provide haptic feedback. Separate from, and possibly simultaneously with the control of the cantilever actuator, user input may be
(Continued)

received through the transistor integrated with the cantilever actuator.

20 Claims, 9 Drawing Sheets

(51) Int. Cl.
*G06F 3/041* (2006.01)
*H01L 41/113* (2006.01)
*H01L 27/20* (2006.01)

(56) References Cited

U.S. PATENT DOCUMENTS

| | | | |
|---|---|---|---|
| 5,872,372 A | 2/1999 | Lee et al. | 257/254 |
| 7,104,134 B2 | 9/2006 | Amano et al. | 73/704 |
| 7,253,488 B2 | 8/2007 | Zhan et al. | 257/414 |
| 7,400,750 B2 | 7/2008 | Nam | 382/124 |
| 7,683,323 B2 | 3/2010 | Kymissis | 250/338.3 |
| 7,755,607 B2 | 7/2010 | Poupyrev et al. | 345/156 |
| 8,120,232 B2 | 2/2012 | Daniel et al. | 310/330 |
| 8,288,776 B2 | 10/2012 | Choi et al. | 257/79 |
| 8,519,449 B2 | 8/2013 | Dumitru et al. | 257/254 |
| 8,680,514 B2 | 3/2014 | Park et al. | 257/40 |
| 8,785,914 B2 | 7/2014 | Choi et al. | 257/40 |
| 9,690,413 B2* | 6/2017 | Filiz | G06F 3/0414 |
| 2006/0071286 A1 | 4/2006 | Axelrod et al. | 257/414 |
| 2007/0103449 A1 | 5/2007 | Laitinen et al. | 345/173 |
| 2009/0129031 A1 | 5/2009 | Someya et al. | 361/729 |
| 2009/0167704 A1 | 7/2009 | Terlizzi et al. | 345/173 |
| 2011/0043077 A1 | 2/2011 | Yeh et al. | 310/338 |
| 2011/0261021 A1 | 10/2011 | Modarres et al. | 345/177 |
| 2011/0309415 A1 | 12/2011 | Ng et al. | 257/254 |
| 2012/0058597 A1 | 3/2012 | Anthopoulos et al. | 438/104 |
| 2013/0176265 A1* | 7/2013 | Zurek | G06F 1/3262 345/174 |
| 2013/0257744 A1 | 10/2013 | Daghigh et al. | 345/173 |
| 2013/0265256 A1 | 10/2013 | Nathan et al. | 345/173 |
| 2014/0191221 A1 | 7/2014 | Benwadih et al. | 257/40 |
| 2014/0217395 A1 | 8/2014 | Facchetti et al. | 257/43 |
| 2015/0177078 A1* | 6/2015 | Dumitru | G01L 1/16 73/777 |
| 2015/0357374 A1* | 12/2015 | Wang | H01L 27/20 257/417 |
| 2017/0155038 A1* | 6/2017 | Caraveo | H01L 41/094 |

FOREIGN PATENT DOCUMENTS

| | | |
|---|---|---|
| EP | 1571586 A2 | 9/2005 |
| EP | 2381340 A2 | 10/2011 |
| EP | 2653844 A1 | 10/2013 |
| JP | 2007079172 A | 3/2007 |
| WO | WO 2006138072 | 12/2006 |
| WO | WO 2009123769 A1 | 10/2009 |

OTHER PUBLICATIONS

International Search Report and Written Opinion for PCT/IB2016/053279, dated Aug. 24, 2016.
Caraveo-Frescas et al., "Polymer ferroelectric field-effect memory device with SnO channel layer exhibits record hole mobility" *Scientific Reports* 4(5243):1-7, 2014.
Caraveo-Frescas et al., "Record Mobility in Transparent p-Type Tin Monoxide Films and Devices by Phase Engineering" *ACS Nano* 7(6):5160-5167, 2013.
Dahiya et al. "Piezoelectric oxide semiconductor field effect transistor touch sensing devices" *Appl. Phys. Lett.*, vol. 95 pp. 034105, 2009.
Dahiya et al. "Tactile Sensing-From Humans to Humanoids" *IEEE Trans. Robotics*, vol. 26 pp. 1-20, 2010.
Fortunato et al. "Flexible tactile sensors based on polysilicon TFT technology for robotics application" Istituto Italiano di tecnologia, Italia, *IMID Digest* 2012.
Graz et al. "Flexible ferroelectric field effect transistor for large area sensor skins and microphones" *Appl. Phys. Lett.*, vol. 85 pp. 073501, 2006.
Qin, *The Optical and Dielectric Applications of Poly(Vinylidene Fluoride) Based Electro-Active Polymers*, Pennsylvania State University Doctoral Dissertation, 2008.
Ray et al. "A TFT embedded cantilever (CantiFET) platform for sensor applications" 2013 *IEEE International Conference of Electron Devices and Solid State Circuits*. pp. 978.
Vishniakou et al., "Tactile Feedback Display with Spatial and Temporal Resolutions" *Scientific Reports* 3(2521):1-7, 2013.
Wang et al., "Piezoelectric Field Effect Transistor and Nanoforce Sensor Based on a Single ZnO Nanowire" *Nano Lett.* 6(12):2768-2772, 2006.
Written Opinion for SG11201607625Q, dated Mar. 21, 2017.
Notice of Reasons for Rejection for JP2016-556703 dated Jun. 1, 2017.

* cited by examiner

INTEGRATED PIEZOELECTRIC CANTILEVER ACTUATOR AND TRANSISTOR FOR TOUCH INPUT AND HAPTIC FEEDBACK APPLICATIONS

CROSS-REFERENCE TO RELATED APPLICATIONS

This application is a national phase application under 35 U.S.C. § 371 of International Application No. PCT/IB2016/053279, filed Jun. 3, 2016, which claims the benefit of priority of U.S. Provisional Patent Application No. 62/185,506, filed Jun. 26, 2015. The entire contents of each of the above-referenced disclosures are specifically incorporated herein by reference without disclaimer.

FIELD OF THE DISCLOSURE

The instant disclosure relates to user input and interaction with electronic devices. More specifically, this disclosure relates to processing user input and providing haptic feedback to a user through a piezoelectric cantilever.

BACKGROUND

Electronic devices, particularly consumer electronics, must interact with users of the devices by means for receiving input from the user and means for providing output to the user. Conventional forms of input include keyboard and mouse devices, but also include newer touch screen devices. Conventional forms of output include digital displays and toggle lights, but also include newer liquid crystal display (LCD) technology.

Another form of output that many electronic devices provide is haptic feedback. For example, many smartphones include a rotating mass motor that vibrates when users touch the screen or to indicate a notification of new email or incoming call. However, this haptic feedback is extremely limited and is not localized to any particular part of the smartphone. Further, the motor is a large physical object that restricts smartphone design and limits the ability of designers to reduce the thickness and other dimensions of the smartphone. Additionally, the motor consumes significant power in comparison to the capability provided by the motor, particularly in comparison to the thin-film semiconductor-based components within the smartphone.

Many of these same electronic devices rely on tactile sensing for receiving input from the user. One conventional tactile sensing technology is illustrated in FIG. 1. FIG. 1 is a conventional smartphone with capacitive touchscreen. A smartphone 100 may include a rotating mass motor 110 for providing the haptic feedback described above. The smartphone 100 may also include a touch screen 120. A portion of the touch screen 120 is blown out to show a profile of the screen 120, which includes a transparent material 122. The transparent material 122 may be laid over sensors 124A-E. The sensors 124A-E may detect user input, such as force applied to the transparent material 122, as changes in capacitance at each of the sensors 124A-E. For example, a user pressing the screen 120 near sensor 124C would cause a change in capacitance 126B, 126C, and 126D in the screen 120 detectable by sensors 124B, 124C, and 124D, respectively. A processor within the smartphone 100 may detect the change in capacitances 126B, 126C, and 126D and correlate them with known x and y locations of the sensors 124B, 124C, and 124D to determine the user input location. The configuration of motor 110 and touch screen 120 separates the user input from the haptic feedback. Further, the haptic feedback is not correlated with the touch screen 120 in that haptic feedback cannot be delivered to particular locations of the touch screen 120.

Other conventional tactile sensing technologies include, for example, resistive or piezoresistive sensors that process input based on a resistance change as a function of the contact location and/or applied force. These resistive sensors consume significant amounts of power. They also can measure only one contact point and cannot detect the amount of force applied. Another conventional tactile sensing technology is a tunnel effect sensor that converts stress into modulated current density by means of the quantum tunneling effect. However they require a charge-couple device (CCD) camera, which is bulky and difficult to integrate into an electronic device. Yet another conventional tactile sensing technology is a capacitive sensor, which detects input based on a change of capacitance in a contact point. This technology provides static detection, but lacks the ability to quantify the amount of force or pressure applied. Yet other conventional tactile sensing technologies include ultrasonic-based sensors, optical sensors, and magnetism-based sensors. However, these sensors are all difficult to integrate into electronic devices because of weight and size issues.

Only some drawbacks to conventional electronic devices and input and output to those devices are described above. However these drawbacks illustrate a need for further improvements in user input and user feedback to improve capability of electronic devices, such as consumer smartphones, to interact with users.

SUMMARY

User feedback may be generated and user input received through a single semiconductor component integrated into the electronic device. The single semiconductor component may include a piezoelectric cantilever actuator integrated with a transistor, such as a thin-film transistor, such that the actuator is electrically isolated from the transistor but mechanically attached to the transistor. One manner of integration is to extend a piezoelectric thin film of the actuator into a gate electrode stack of the transistor. The piezoelectric thin film may generally be an insulating material, such that metal films may be deposited around a portion of the piezoelectric material away from the gate electrode stack of the transistor. These metal films include two electrodes to control deflection of the actuator without signals applied to two electrodes affecting the transistor. Separate from, and in some embodiments simultaneously with, the controlled deflection of the actuator, the piezoelectric film that extends into the gate electrode stack of the transistor may alter electrical characteristics of the transistor based on a force applied to the actuator. The extension of the piezoelectric film into the transistor may induce charges at an interface of the gate electrode stack of the transistor based on a force applied to the actuator. The induced charges may cause a change in threshold voltage of transistor, which may be detected through appropriate circuitry coupled to the transistor.

The single semiconductor component integrating transistor with cantilever actuator may be part of an array of such components. For example, an array may span the integrated components across multiple fingers of a glove or an array may span the integrated components across a display device in a smartphone. Such an array of integrated components may be coordinated by a processor to provide touch feedback, such as simulating physical buttons. This localized haptic feedback may be delivered by means of static deflection, as buttons that pop out in the display, or by vibration using the cantilever actuator. Such an array of integrated components may also be used to receive user input, such as user input that interacts with the raised button generated by the cantilever actuator. The cantilever actuator can provide multi-signal detection, such as force, pressure, vibration, and/or temperature detection.

According to one embodiment, an apparatus may include a transistor comprising at least a source electrode, a drain electrode, and a gate electrode. The apparatus may also include a cantilever actuator comprising a piezoelectric material, wherein the cantilever actuator is electrically isolated but mechanically connected to and integrated with the transistor through the gate electrode of the transistor, wherein the cantilever actuator comprises at least two electrodes separate from the source electrode, the drain electrode, and the gate electrode, wherein the at least two electrodes comprise a first electrode and a second electrode, and wherein the at least two electrodes allow for simultaneous actuating of the cantilever actuator separate from accessing of the transistor through the source electrode, the drain electrode, and the gate electrode.

According to another embodiment, an electronic device capable of providing haptic feedback to a user is disclosed. The electronic device may include an array of haptic feedback devices, wherein at least one haptic feedback device of the array of haptic feedback devices includes a transistor comprising at least a source electrode, a drain electrode, and a gate electrode, and a cantilever actuator comprising a piezoelectric material. The cantilever actuator may be electrically isolated but mechanically connected to and integrated with the transistor through the gate electrode of the transistor. The cantilever actuator may include at least two electrodes separate from the source electrode, the drain electrode, and the gate electrode. Further, the at least two electrodes may allow for simultaneous actuating of the cantilever actuator separate from accessing of the transistor through the source electrode, the drain electrode, and the gate electrode. The electronic device may include a mobile device, a cellular phone, a laptop, a tablet, a media player, a global positioning system (GPS) device, an e-book reader, a patch, and/or a glove.

According to a further embodiment, a method may include detecting, through a transistor, a change in induced charge of a piezoelectric film of indicative of a user input to an electronic device, wherein the piezoelectric film is electrically isolated from the transistor but mechanically connected to the transistor; determining, by a processor coupled to the transistor, whether a pressure was to the sensor based, at least in part, on the change in induced charge, wherein the change in induced charge is determined based, at least in part, on a threshold voltage of a transistor coupled to the piezoelectric film; processing, by the processor, the user input based, at least in part, on the determined pressure at the sensor; and/or performing, by the processor, an operation based, at least in part, on the received user input.

According to yet another embodiment, a method of manufacturing the single semiconductor component for an electronic device may include depositing a top gate structure on a substrate; depositing an active semiconductor layer on the top gate structure to form a stack; depositing source and drain electrodes on the stack; depositing a piezoelectric layer on the stack; depositing a top gate electrode on the piezoelectric layer on the stack; and/or patterning the stack to form individual cells each comprising a transistor and a cantilever actuator.

According to one embodiment, a method of operating an electronic device with a single semiconductor component integrating a transistor with a cantilever actuator may include receiving a control signal from a processor indicating a type of haptic feedback to provide to a user; generating a feedback signal according to the indicated type of haptic feedback; and/or applying the feedback signal to the first electrode and the second electrode to induce the indicated type of haptic feedback in the cantilever actuator. The type of haptic feedback may include simulating a button on the display device and/or creating a vibration.

According to a further embodiment, an apparatus may include a first semiconductor channel region; a second semiconductor channel region; a dielectric layer over the first semiconductor channel region and the second semiconductor channel region; a piezoelectric layer over the first semiconductor channel region and the second semiconductor channel region; and/or a gate electrode over the first semiconductor channel region and the second semiconductor channel region. The first semiconductor channel region comprises a p-type semiconductor, and where the second semiconductor channel region comprises a n-type semiconductor. The apparatus may also include a first source electrode coupled to the first semiconductor channel region; a second source electrode coupled to the second semiconductor channel region; and/or a drain electrode coupled to the first semiconductor channel region and coupled to the second semiconductor channel region. The apparatus may further include a first sensor circuit coupled to the first source electrode and the drain electrode, wherein the first sensor circuit is configured to measure a piezoelectric effect within the piezoelectric layer; and/or a second sensor circuit coupled to the second source electrode and the drain electrode, wherein the second sensor circuit is configured to measure a pyroelectric effect within the piezoelectric layer.

In the context of the present invention, twenty-four (24) embodiments are described. Embodiment 1 includes an apparatus. The apparatus includes a transistor comprising at least a source electrode, a drain electrode, and a gate electrode; and a cantilever actuator comprising a piezoelectric material, wherein the cantilever actuator is electrically isolated but mechanically connected to and integrated with the transistor through the gate electrode of the transistor, wherein the cantilever actuator comprises at least two electrodes separate from the source electrode, the drain electrode, and the gate electrode, wherein the at least two electrodes comprise a first electrode and a second electrode, and wherein the at least two electrodes allow for simultaneous actuating of the cantilever actuator separate from accessing of the transistor through the source electrode, the drain electrode, and the gate electrode. Embodiment 2 is the apparatus of embodiment 1, further including a sensing circuit coupled to at least the source electrode, the drain electrode, and the gate electrode of the transistor, wherein the sensing circuit is configured to detect pressure applied to the cantilever actuator by sensing a change in the threshold voltage of the transistor. Embodiment 3 is the apparatus of embodiment 2, wherein the piezoelectric material includes a pyroelectric material, and wherein the sensing circuit is configured to detect a temperature of an environment around the cantilever actuator. Embodiment 4 is the apparatus of any one of embodiments 1 to 3, further including a haptic feedback circuit coupled to the at least two electrodes of the cantilever actuator. Embodiment 5 is the apparatus of embodiment 4, wherein the haptic feedback circuit is configured to generate a direct current (DC) signal to deflect the cantilever actuator. Embodiment 6 is the apparatus of embodiment 5, wherein the haptic feedback circuit is configured to simulate a button raising from a surface. Embodiment 7 is the apparatus of embodiment 4, wherein the haptic feedback circuit is configured to generate an alternating current (AC) signal to deflect the cantilever actuator. Embodiment 8 is the apparatus of embodiment 7, wherein the haptic feedback circuit is configured to generate a shake effect. Embodiment 9 is the apparatus of any one of embodiments 1 to 8, wherein the cantilever actuator includes PVDF. Embodiment 10 is the apparatus of any one of embodiments 1 to 9, wherein the cantilever actuator includes a load attached at a distal end of the piezoelectric material from the transistor. Embodiment 11 is the apparatus of any one of embodiments 1 to 10, wherein the transistor includes at least one of a staggered bottom gate thin film transistor (TFT), a coplanar bottom-gate TFT, a staggered top-gate TFT, and a coplanar top-gate TFT. Embodiment 12 is the apparatus of any one of embodiments 1 to 11, wherein the transistor and the cantilever are integrated in a display device, wherein the display device is part of an electronic device comprising at least one of a mobile device, a cellular phone, a laptop, a tablet, a media player, a global positioning system (GPS) device, and an e-book reader.

Embodiment 13 includes an electronic device capable of providing haptic feedback to a user. The electronic device can include an array of haptic feedback devices, wherein at least one haptic feedback device of the array of haptic feedback devices includes: a transistor comprising at least a source electrode, a drain electrode, and a gate electrode; and a cantilever actuator comprising a piezoelectric material, wherein the cantilever actuator is electrically isolated but mechanically connected to and integrated with the transistor through the gate electrode of the transistor, wherein the cantilever actuator comprises at least two electrodes separate from the source electrode, the drain electrode, and the gate electrode, wherein the at least two electrodes comprise a first electrode and a second electrode, and wherein the at least two electrodes allow for simultaneous actuating of the cantilever actuator separate from accessing of the transistor through the source electrode, the drain electrode, and the gate electrode. Embodiment 14 is the haptic feedback-enabled device of embodiment 13, further including a processor coupled to the array of haptic feedback devices, wherein the processor is configured to receive signals from the array of haptic feedback devices and is configured to determine a user input based on the received signals. Embodiment 15 is the haptic feedback-enabled device of any one of embodiment 13 to 14, further including a processor coupled to the array of haptic feedback devices, wherein the processor is configured to determine a haptic feedback sensation to provide to a user and configured to generate signals that when provided to the array of haptic feedback devices cause the user to receive the determined haptic feedback sensation. Embodiment 16 is the haptic feedback-enabled device of any one of embodiments 13 to 15, further including a display device, wherein the array of haptic feedback devices is positioned above the display device.

Embodiment 17 includes a method that can include detecting, through a transistor, a change in induced charge of a piezoelectric film of indicative of a user input to an electronic device, wherein the piezoelectric film is electrically isolated from the transistor but mechanically connected to the transistor; determining, by a processor coupled to the transistor, whether a pressure was to the sensor based, at least in part, on the change in induced charge, wherein the change in induced charge is determined based, at least in part, on a threshold voltage of a transistor coupled to the piezoelectric film; processing, by the processor, the user input based, at least in part, on the determined pressure at the sensor; and performing, by the processor, an operation based, at least in part, on the received user input. Embodiment 18 is the method of embodiment 17, further including outputting a signal to the piezoelectric film of the sensor, wherein the signal induces movement an actuator of the sensor, wherein the signal comprises a direct current (DC) signal selected to move the actuator a determined distance. Embodiment 19 is the method of embodiment 17, further including outputting a signal to the piezoelectric film of the sensor, wherein the signal includes an alternating current (AC) signal selected to induce vibration in the actuator. Embodiment 20 is the method of any one of embodiments 17 to 19, wherein the step of detecting the change in induced charge and the step of outputting the signal to the piezoelectric film are performed simultaneously.

Embodiment 21 is the apparatus of any one of embodiments 1 to 12, wherein the transistor further includes a first semiconductor channel region; a second semiconductor channel region; a dielectric layer over the first semiconductor channel region and the second semiconductor channel region; and a piezoelectric layer over the first semiconductor channel region and the second semiconductor channel region, wherein the gate electrode extends over the first semiconductor channel region and over the second semiconductor channel region. Embodiment 22 is the apparatus of embodiment 21, wherein the first semiconductor channel region comprises a p-type semiconductor, and where the second semiconductor channel region includes a n-type semiconductor. Embodiment 23 is the apparatus of any one of embodiments 21 to 22, further including a first source electrode coupled to the first semiconductor channel region; a second source electrode coupled to the second semiconductor channel region; and a drain electrode coupled to the first semiconductor channel region and coupled to the second semiconductor channel region. Embodiment 24 is the apparatus of embodiment 23, further including a first sensor circuit coupled to the first source electrode and the drain electrode, wherein the first sensor circuit is configured to measure a piezoelectric effect within the piezoelectric layer; and a second sensor circuit coupled to the second source electrode and the drain electrode, wherein the second sensor circuit is configured to measure a pyroelectric effect within the piezoelectric layer.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
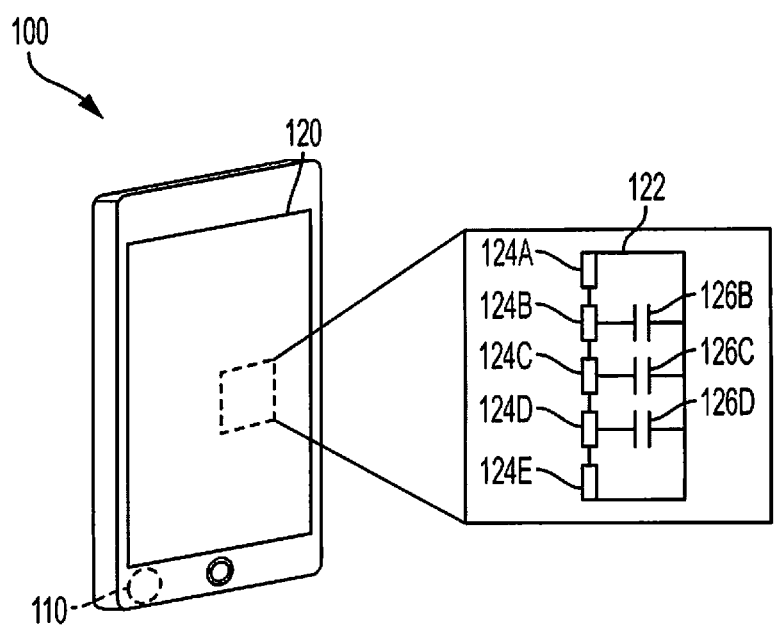
FIG. 1 is a conventional smartphone with capacitive touchscreen.
Figure 2:
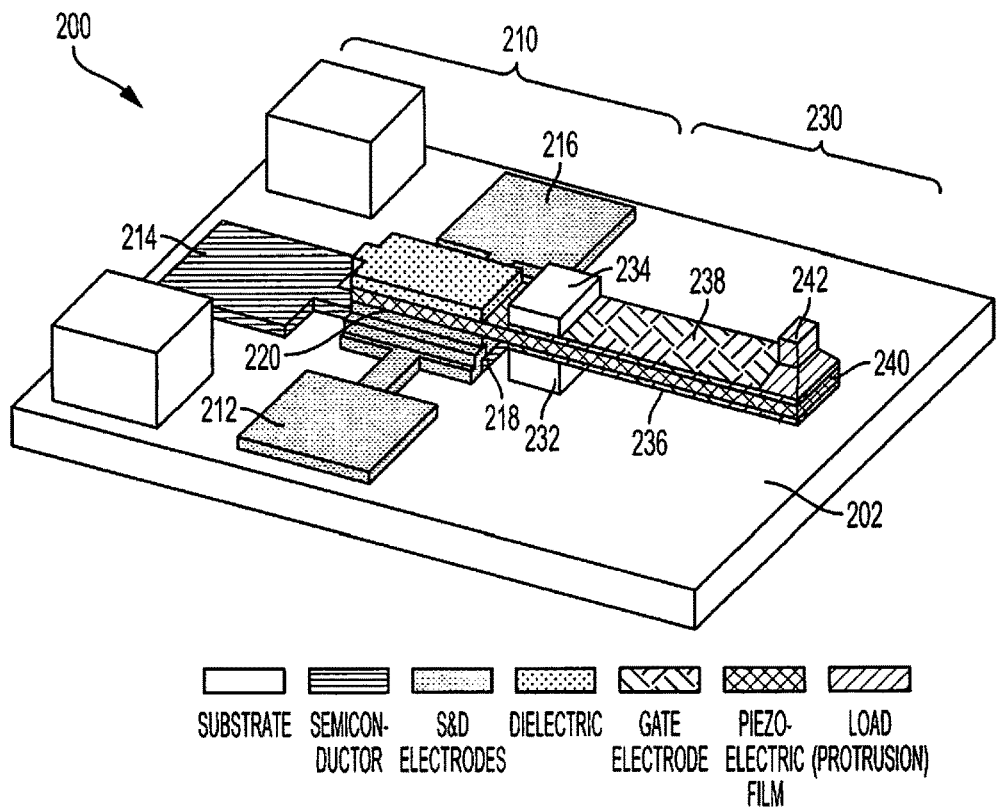
FIG. 2 is an illustration showing a single semiconductor component integrating a transistor with cantilever actuator according to one embodiment of the disclosure.

FIG. 2 is an illustration showing a single semiconductor component integrating a transistor with cantilever actuator according to one embodiment of the disclosure. A single semiconductor component 200 includes a cantilever actuator 230 and a transistor 210, such as a thin film transistor (TFT). The cantilever actuator 230 may include a piezoelectric film 240 that extends from the cantilever actuator 230 into the transistor 210. In particular, the piezoelectric film 240 may extend into a gate electrode stack of the transistor 210, between a gate electrode 214 and the semiconductor channel 218. Because the piezoelectric film 240 is generally a poor conductor, the cantilever actuator 230 is thus electrically isolated from the transistor 210 but mechanically attached to the transistor 210.

The cantilever actuator 230 may also include a first conducting layer 236, a second conducting layer 238, a first electrode coupled to the first conducting layer 236, and a second electrode coupled to the second conducting layer 238. Although the first and second electrodes are referred to as structural elements, the electrodes may be the first conducting layer 236 and the second conducting layer 238 themselves. Alternatively, an additional structure for a contact point may be attached to the first conducting layer 236 and the second conducting layer 238, such as a bonding pad. The first conducting layer 236 may be deposited on one side of the piezoelectric film 240, and the second conducting layer 238 may be deposited on approximately an opposite side of the piezoelectric film 240. The first and second conducting films 236 and 238 are coupled to the first electrode and the second electrode, respectively. The first and second conducting films 236 and 238 may be electrically isolated from the transistor 210, such that a signal may be applied to the first electrode and the second electrode to cause the piezoelectric layer 240 to respond by, for example, deflecting or vibrating. In one embodiment, the actuator 230 may include anchors 232 and 234 for anchoring the actuator 230 with the substrate 202.

The cantilever actuator 230 may have a load 242 (or protrusion) to adjust vibration parameters such as amplitude and frequency of the cantilever actuator 230. The load 242 may also be used, such as when integrated in a display device, to act as a physical button that pops out of the screen. When a direct current (DC) voltage is applied to the first and second electrodes, the piezoelectric film 240 deflects proportional to the magnitude of the DC voltage. A DC signal may thus be applied to the first and second electrodes that simulates a button raising from a surface of a display device, which provides direct-to-skin feedback to a user. When an alternating current (AC) voltage is applied to the first and second electrodes, the piezoelectric film 240 vibrates with a certain amplitude, phase, and frequency corresponding to the AC signal. An AC signal may thus be applied to create a "shake" effect in a localized area, such as a portion of a display device. By altering the AC signal to vary the vibration parameters, different sensations may be generated.

The single semiconductor component 200 may be constructed on a substrate 202, such as glass, polycarbonate, PMMA, PET, PEN, Polyimide, or any other transparent polymer or transparent inorganic substrate. The electrodes 212, 214, 216, 236, and 238 may be constructed from conductive transparent polymers such as PEDOT:PSS, transparent conductive oxides such as ITO, AZO, F:SnO2 and zinc-based oxides, graphene and graphene-like materials, metal-based nanowires and/or nanoparticles such as silver nanowires, copper nanowires, carbon nanotubes and other carbon-based structures, a metal mesh, or a nanomesh. Each of the electrodes 212, 214, 216, 236, and 238 may be constructed from different materials or some of the electrodes 212, 214, 216, 236, and 238 may be construed from the same materials. The semiconductor 218 may be constructed from p-type materials such as SnO, Cu$_2$O, CuO, Ga:SnO$_2$. Organic semiconductors such as pentacene, and/or other small molecule materials or may be constructed from n-type materials such as ZnO, IGZO, SnO$_2$, a-Si:H, zinc based materials, In$_2$O$_3$, and/or CdO. The dielectric layer 220 may be constructed from oxide-based dielectrics such as SiO$_2$, TiO$_2$, Al$_2$O$_3$, HfO$_2$, linear polymer dielectrics such as PMMA and SU-8, or other insulating materials. The piezoelectric layer 240 may be constructed from PVDF and its copolymers, such as PVDF-TrFE and PVDF-TrFE-CFE, Parylene, PDMS, Polypropylene, voided charged polymers, transparent nanocomposites, such as ZnO in a SU-8 matrix, or other piezoelectric materials. In some embodiments, the piezoelectric layer 240 may also exhibit pyroelectric effects allowing use of the single semiconductor component 200 to detect changes in temperature in the proximity of the component 200.

The transistor 210 may include a bilayer gate dielectric including a dielectric material 220 and the piezoelectric film 240 that extends from the cantilever actuator 230. When the cantilever actuator 230 is in its steady state with no applied strain, the transistor 210 has a first threshold voltage ($V_T$) and shows equilibrium behavior. In particular, the transistor 210 exhibits, during equilibrium behavior, no hysteresis such that the transfer curve, which describes the behavior of the transistor 210, retraces itself when multiple scans are performed. The following equation describes the current that flows from a source electrode 212 to a drain electrode 216 through a p-type semiconductor channel 218 when a voltage is applied at the gate electrode 214:

$$I_{DS} = -\mu_{FE} C_{ox} \frac{W}{L} \left[ (V_{GS} - V_T) V_{DS} - \frac{1}{2} V_{DS}^2 \right],$$

where $I_{DS}$ is the source-to-drain current, $\mu_{FE}$ is field effect mobility, $C_{OX}$ is the gate dielectric capacitance, W/L is the width to length ratio of the semiconductor channel 218, $V_{GS}$ is the gate voltage, $V_T$ is the threshold voltage, and $V_{DS}$ is the source-to-drain voltage. Although a p-type semiconductor channel 218 is described, the semiconductor channel 218 may also be n-type and similar equations derived to describe the operation of such an NMOS transistor 210. Using this equation, the threshold voltage $V_T$ of the transistor 210 may be determined and compared to a previous determination and/or a look-up table to determine changes in the threshold voltage $V_T$ and determine whether a pressure or force has been applied to the cantilever actuator 230. The single semiconductor component 200 of FIG. 2 may be coupled to circuitry to perform this determination of threshold voltage $V_T$ and or to perform other operations with the single semiconductor component 200, such as causing deflection or vibration of the cantilever actuator 230.

Figure 3:
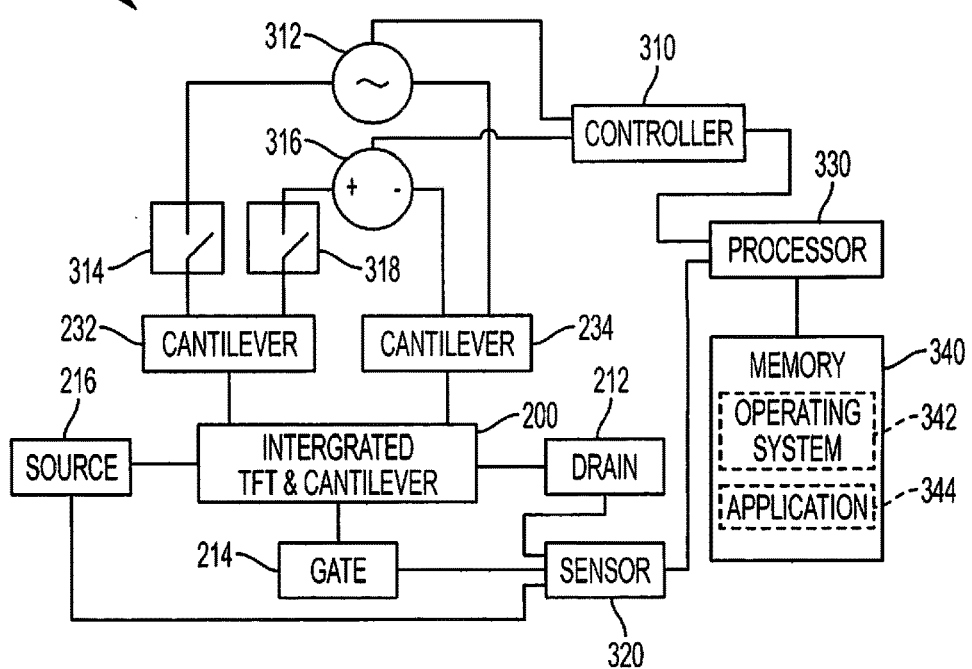
FIG. 3 is a block diagram illustrating operation of the single semiconductor component of FIG. 2 according to certain embodiments of the disclosure.

FIG. 3 is a block diagram illustrating operation of the single semiconductor component of FIG. 2 according to certain embodiments of the disclosure. An electronic device 300 may include the single semiconductor component 200, which may be the integrated TFT transistor 210 and cantilever actuator 230 illustrated in FIG. 2. The single semiconductor component 200 may have several electrodes for communicating with other circuitry, including the drain electrode 212, the gate electrode 214, the source electrode 216, the first cantilever electrode, and the second cantilever electrode. An alternating current (AC) voltage source 312 may be coupled between the first and second cantilever electrodes. The AC voltage source 312 may be disconnected from the electrodes by a switch 314. The AC voltage source 312 may provide a signal to the cantilever actuator 230 to create, for example, vibration feedback to a user. Additionally or alternatively, a direct current (DC) voltage source 316 may be coupled between the first and second cantilever electrodes. The DC voltage source 316 may be disconnected from the electrodes by a switch 318. The DC voltage source 316 may provide a signal to the cantilever actuator 230 to create, for example, a static deflection that creates a physical button on a display device.

Haptic feedback may be provided by the single semiconductor component 200 by a controller 310. The controller 310 may be coupled to the voltage sources 312 and 316 to generate control signals that cause the sources 312 and 316 to apply signals to the cantilever actuator 230 that result in a desired effect. The desired effect may be determined by a processor 330 coupled to the controller 310. The processor 330 may execute an operating system 342 and/or an application 340 stored in memory 340, and that operating system 342 and application 340 may include code that interacts with a user by providing haptic feedback. For example, the application 340 may instruct the processor 330, through an application programming interface (API) to the operating system 342, to create a button on a display device (not shown). That display device may include an array of single semiconductor components, such as the integrated transistor and cantilever 200. The processor 330 may then instruct the controller 310 to create static deflection at particular locations within the array of components. The controller 310 may then determine that the component 200 is within the bounds of the desired button and instruct the DC voltage source 316 to cause deflection of the cantilever actuator of the component 200. Although a separate controller 310 and processor 330 are described, functionality assigned to either the controller 310 or the processor 330 may alternatively be assigned to other circuitry. For example, the functionality performed by the controller 310 may be integrated within the processor 330. The controller 310 may also control the switches 314 and 318 to coupled or disconnect the sources 312 and 316 depending on the desired haptic feedback to provide to a user.

The single semiconductor component 200 may also be used to sense pressure, force, and/or other quantities through sensor circuitry 320. The sensor 320 may be coupled to one or more of the drain electrode 212, the gate electrode 214, and the source electrode 216. The sensor 320 may perform operations such as, for example, the measurement of a threshold voltage $V_T$ of the transistor 210 of the component 200. During the measurement of the threshold voltage $V_T$ or other measurements, the sensor 320 may apply various voltages $V_G$ to the gate electrode 214 and measure currents $I_{DS}$ through the drain electrode 212 and the source electrode 216. The sensor 320 may report measurement values to the processor 330, where the processor 330 may perform further calculations to determine, for example, an amount of applied force, applied pressure, or other quantity. Further calculations performed by the processor 330 may include, for example, determining a user input to an electronic device, such as where on a touchscreen a user touched or determining a gesture that was input to the touchscreen by a user. The processor 330 may report this user input to the operating system 342 and/or the application 340. The operating system 342 and/or the application 340 may then take appropriate action in response to the user input. Although a separate sensor 320 and processor 330 are described, functionality assigned to either the sensor 320 or the processor 330 may alternatively be assigned to other circuitry. For example, the functionality performed by the sensor 320 may be integrated within the processor 330.

Figure 4A:
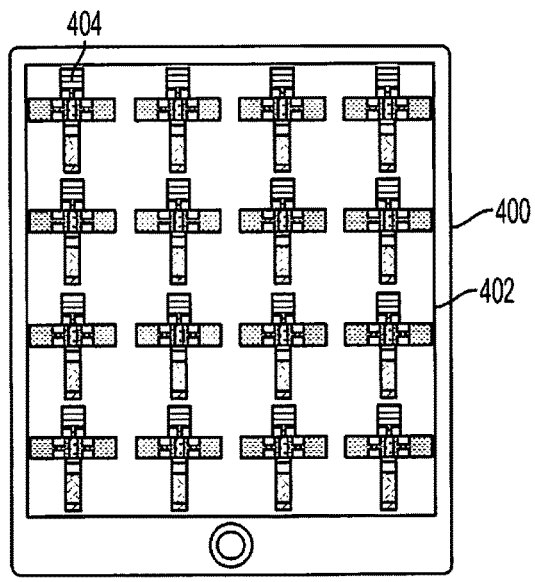
FIGS. 4A-C are illustrations of electronic devices integrating one or more single semiconductor components integrating transistor with cantilever actuator according to certain embodiments of the disclosure.
Figure 4B:
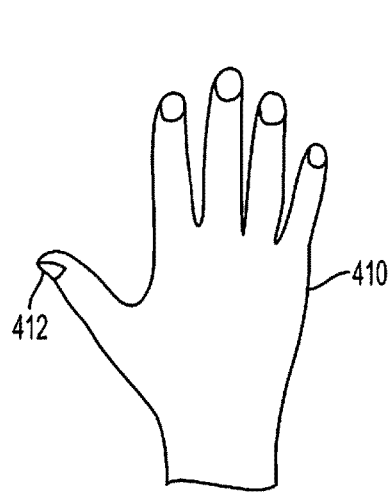
Figure 4C:
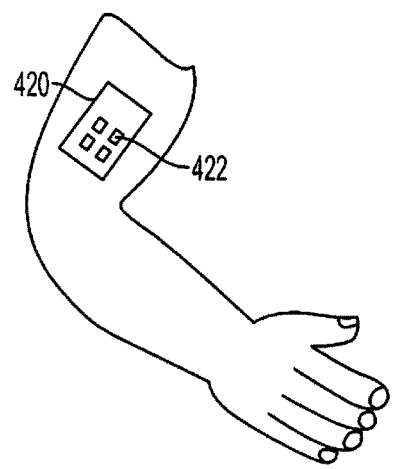

One or more single semiconductor components, such as illustrated in FIG. 2, along with supporting circuitry, such as illustrated in FIG. 3, may be incorporated into electronic devices to provide input/output functionality. For example, user input may be received through the transistor 210 of the single semiconductor component 200 of FIG. 2, and haptic feedback may be provided through the cantilever actuator 230. FIGS. 4A-4C are illustrations of electronic devices integrating one or more single semiconductor components integrating transistor with cantilever actuator according to certain embodiments of the disclosure.

FIG. 4A illustrates a smartphone 400, which includes a display device 402 incorporating an array of single semiconductor components 404, such as the integrated sensor and cantilever actuator illustrated in FIG. 2. When the smartphone 400 is constructed, the components 404 may be laid over top of a display, such as a liquid crystal display (LCD). Additional components and/or protective layers may be deposited over the components 404. The components 404 may be used to deliver localized haptic feedback on the display device 402 and/or to receive user input regarding where on the display device 402 the user touched.

FIG. 4B illustrates a glove 410 including one or more of components 412, such as the integrated sensor and cantilever actuator illustrated in FIG. 2. The components 412 may be arranged in various locations on the glove 410, such as on fingertips of the glove 410. The components 412 may be coupled to a processor and other circuitry integrated into the glove 410. Alternatively, the glove 410 may communicate either through a wired or wireless connection to a device, such as a computer or a smartphone, that processes signals from and generates control signals for the components 412. The glove 410 may provide haptic feedback to the user on particular fingers or particular parts of the user's hand. The glove 410 may also receive user input when a user makes hand motions or wiggles fingers in the glove 410.

FIG. 4C illustrates a patch 420 including one or more components 422, such as the integrated sensor and cantilever actuator illustrated in FIG. 2. The patch 420 may be manufactured as a small substrate intended for application to human skin for healthcare applications. The components 422 may be coupled to a processor and other circuitry integrated into the patch 420. Alternatively, the patch 420 may communicate either through a wired or wireless connection to a device, such as a computer or a smartphone, that processes signals from and generates control signals for the components 422.

Figure 5:
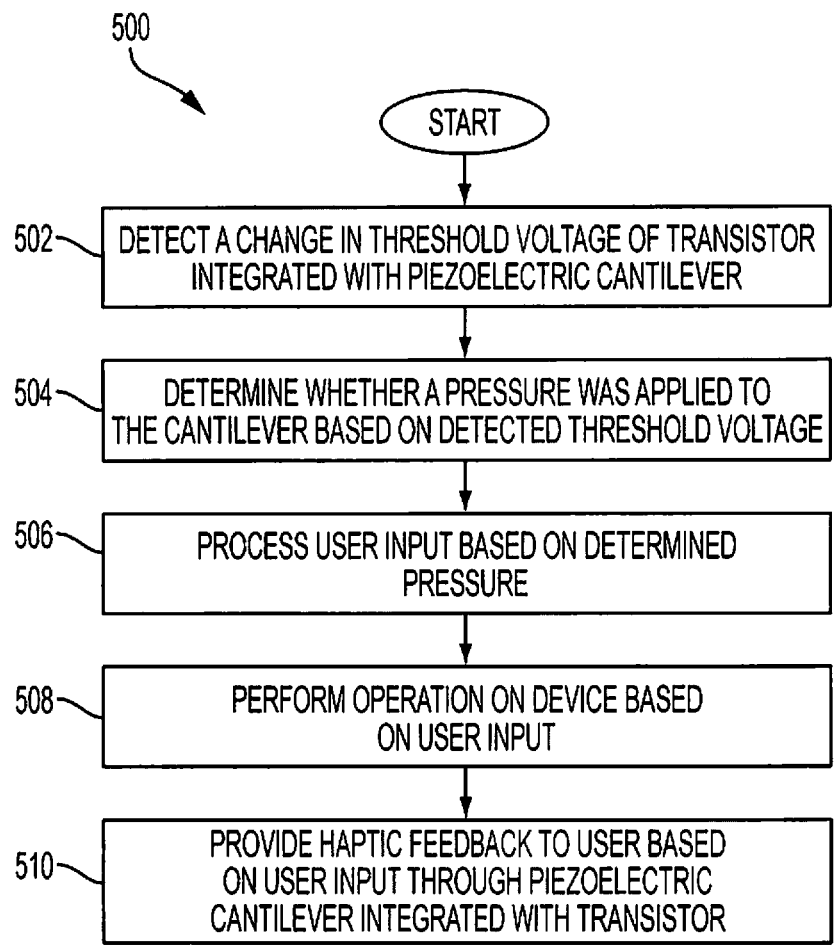
FIG. 5 is a flow chart illustrating a method of receiving user input through a single semiconductor component integrating transistor with cantilever actuator according to one embodiment of the disclosure.

User input may be received through a single semiconductor component 200, such as that illustrated in FIG. 2, by processing information obtained from the component as shown in the flow chart of FIG. 5. FIG. 5 is a flow chart illustrating a method of receiving user input through a single semiconductor component integrating transistor with cantilever actuator according to one embodiment of the disclosure. A method 500 begins at block 502 with detecting a change in threshold voltage $V_T$ of the transistor integrated with the piezoelectric cantilever. The change in threshold voltage $V_T$ may be due to induced charges at the gate electrode of the transistor caused by force, pressure, or another effect on the piezoelectric cantilever. The step at block 502 may include measuring the threshold voltage $V_T$ of the transistor. Then, at block 504, it can be determined from the change in threshold voltage $V_T$ whether a pressure was applied to the cantilever actuator.

After determining that there was a change in threshold voltage $V_T$ and calculating the applied pressure at blocks 502 and 504, user input may be processed at block 506. The steps at block 506 may include, for example, determining where on a touch screen a user applied pressure. The steps at block 506 may also include tracing applied pressure over a portion of the touch screen to determine a gesture was made on the touch screen, such as the circling of a portion of text displayed on the touch screen or highlighting a portion of text displayed on the touch screen. At block 508, an operation is performed on an electronic device based on the processed user input of block 506. For example, the user input circle processed at block 506 may be provided to an application and that application apply highlighting or other text formatting to the circled text.

Then, at block 510, haptic feedback may be provided to a user based on the user input of block 506 or the operation performed at block 508. The haptic feedback may be provided through the same piezoelectric cantilever integrated with the transistor that a threshold voltage $V_T$ change was detected in at block 502. In one embodiment, the feedback may be provided to the user through the same transistors that experienced a change in threshold voltage $V_T$ at block 502. For example, the display screen may vibrate in the proximity of the highlighted text for a short half second or one second vibration to draw the user's attention to the newly highlighted text. In another example, a dialog box may pop up to confirm the user's selection of the text with an "OK" or "Cancel" button. The "OK" and "Cancel" buttons may be raised off the surface of the display screen by applying a DC voltage to certain cantilever actuators where the "OK" and "Cancel" buttons are shown on the display screen. The location of the dialog box may be in the proximity of where the user highlighted text.

Figure 6:
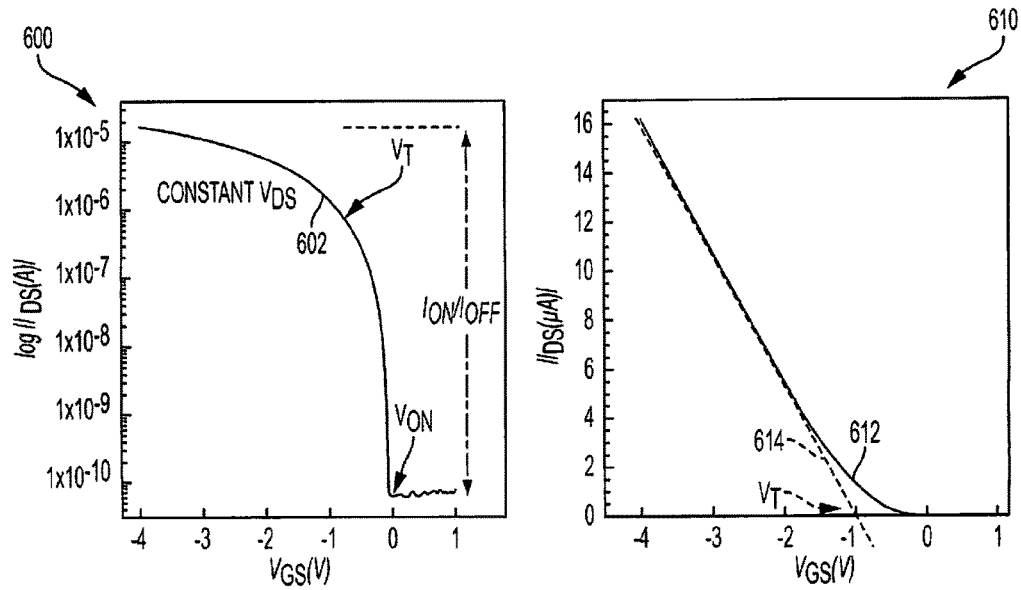
FIG. 6 are graphs illustrating electrical characteristics of a transistor integrated with a cantilever actuator according to certain embodiments of the disclosure.

Referring back to step 502 of FIG. 5, the threshold voltage $V_T$ of the transistor is a measurable electrical characteristic of the transistor. FIG. 6 are graphs illustrating electrical characteristics of a transistor integrated with a cantilever actuator according to certain embodiments of the disclosure. Graph 600 illustrates a line 602 showing a response of the transistor, such as the transistor 210 illustrated in FIG. 2, to varying gate-source voltages $V_{GS}$. Generally, as the magnitude of $V_{GS}$ increases with a fixed drain-to-source voltage $V_{DS}$ current $I_{DS}$, illustrated on the logarithmic y-axis, through the transistor increases. The calculation of a threshold voltage $V_T$ for the transistor is shown in graph 610. The line 612 of graph 610 illustrates the current $I_{DS}$ through the transistor for varying gate-source voltage $V_{GS}$ on a linear scale. A line 614 of the form y=mx+b may be drawn from the slope of the linear region of line 612. The intersection of line 614 with the x-axis indicates the threshold voltage $V_T$ of the transistor. For the transistor measured in line 612 of graph 610, the threshold voltage $V_T$ is approximately 1 Volt. The threshold voltage $V_T$ may be defined as the value of gate-source voltage $V_{GS}$ when the conductive channel (or an accumulation layer near the dielectric/semiconductor interface) just begins to connect the source and drain electrodes. Threshold voltage $V_T$ deviates from the ideal value (approximately 0 V) caused by the gate-semiconductor work function difference, semiconductor background carrier concentration, and the density of trapped charges in the dielectric, the semiconductor and the dielectric/semiconductor interface.

A change in the threshold voltage $V_T$ of a transistor due to induced charges in the gate stack, such as caused by force applied to a cantilever actuator integrated with the transistor can be shown on similar graphs to those as shown in FIG. 6. Under the presence of strain, such as by means of force, pressure, deflection, or vibration, in the cantilever part, charges are induced in the piezoelectric film by its own piezoelectric nature, as described in the following equation:

$$D_3 = d_{33}T_{33} + \epsilon_{33}E_{33}$$

where D is the electric displacement, T the mechanical stress, E the electric field, $d_{33}$ the piezoelectric constant, and $\epsilon_{33}$ the dielectric constant. The voltage as a function of the applied mechanical stress can then be estimated as $$V = E_3 s = \frac{d_{33} T_3 s}{\varepsilon_0 \varepsilon}$$

where s is the thickness, ε the relative permittivity of the piezoelectric material, and $\varepsilon_0$ the dielectric permittivity of vacuum.

These equations illustrate that the electric displacement, or charge, can be controlled by the electric field and the applied force F or stress T. The induced charges, which are proportional to the stress cause the gate dielectric capacitance ($C_{OX}$) of the transistor to change, which modifies the transfer characteristics of the transistor. The change in the gate capacitance, then translates to a change in the threshold voltage $V_T$, which is detectable by appropriate circuitry, such as that described with reference to FIG. 3. Furthermore, the change in threshold voltage $V_T$ may be directly proportional to the strain, as the charges induced in the piezoelectric film are proportional to the strain. For this given configuration, a change in threshold voltage $V_T$, in either a positive or negative direction, may indicate the presence of stress, such as a touch from a user, while the magnitude of the change senses the amount of force exerted on the cantilever actuator. With an array of sensors over an area, such as the area of a touchscreen in a smartphone, pressure can also be sensed, as pressure can be calculated as the force present in a certain area. The number of actuators per square centimeter built into an electronic device may be adjusted to obtain a desired resolution. Further, vibration can be detected by identifying an amplitude and frequency of the change in threshold voltage $V_T$.

Figure 7:
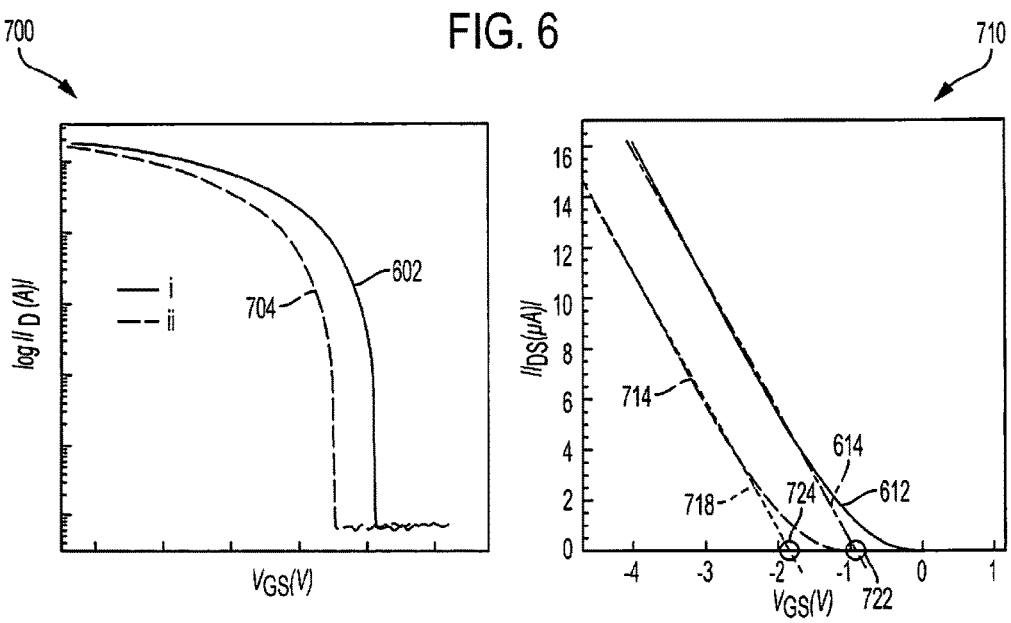
FIG. 7 are graphs illustrating a change in threshold voltage of a transistor integrated with a cantilever actuator based on force applied to the cantilever actuator according to one embodiment of the disclosure.

FIG. 7 are graphs illustrating a change in threshold voltage of a transistor integrated with a cantilever actuator based on force applied to the cantilever actuator according to one embodiment of the disclosure. In graph 700, a transfer characteristic of a transistor having a cantilever actuator under applied stress is shown in line 704, while a transistor having a cantilever actuator with no applied stress is shown in line 602. In graph 710, threshold voltages $V_T$ of the two transistors shown in graph 700 are calculated. The threshold voltage $V_T$ of the first transistor from line 612 can be calculated as intercept 722 at approximately 1 Volt. The threshold voltage $V_T$ of the second transistor from line 714 can be calculated by drawing a line 718 and finding an intercept on the x-axis of approximately 1.75 Volts. Referring back to FIG. 5, this change in threshold voltage of approximately 0.75 Volts may be determined at step 502 of method 500 and further processed through steps 504, 506, and 508 to control an electronic device based on user input received through the single semiconductor component integrating a transistor with a cantilever actuator.

Figure 8:
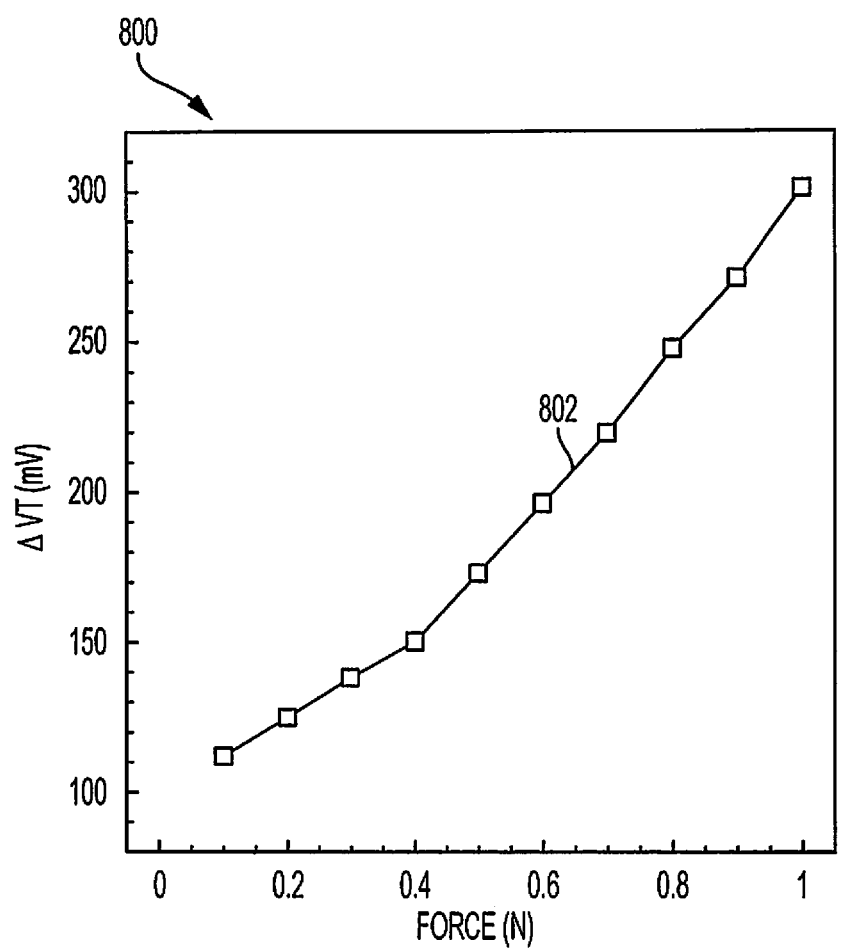
FIG. 8 is a graph illustrating determined force applied to a cantilever actuator based on a change in threshold voltage of a transistor integrated with the cantilever actuator according to one embodiment of the disclosure.

This detected change of threshold voltage $V_T$ in the single semiconductor component may be proportional to a force applied to the cantilever actuator, as illustrated in FIG. 8. FIG. 8 is a graph illustrating determined force applied to a cantilever actuator based on a change in threshold voltage of a transistor integrated with the cantilever actuator according to one embodiment of the disclosure. A graph 800 shows a line 802 illustrating a relationship between an applied force to the cantilever actuator and a measured threshold voltage $V_T$ for a transistor integrated with the cantilever actuator. The line 802 shows an approximately linear relationship between the applied force and the change in threshold voltage $V_T$. Referring back to FIG. 5, when the pressure applied to the cantilever may be determined at block 504 in one embodiment through a known algorithm or equation programmed into a processor, such as the processor 330 of FIG. 3. In another embodiment, a look-up table may be stored in the memory 340 of FIG. 3 such that the processor 330 can translate a detected threshold voltage $V_T$ change into an applied force value. In yet another embodiment, the algorithm, equation, or look-up table may include calibration adjustments. For example, when a user first sets up the electronic device the user may be asked to press at various strengths on the cantilever actuator and the processor 330 may perform measurements as the user provides the calibration input. Such a calibration process may allow the electronic device to adapt for the different pressures that would be applied by different users. The calibration process may also allow the electronic device to adapt for slight manufacturing variances in the integrated transistor and cantilever actuators.

Figure 9:
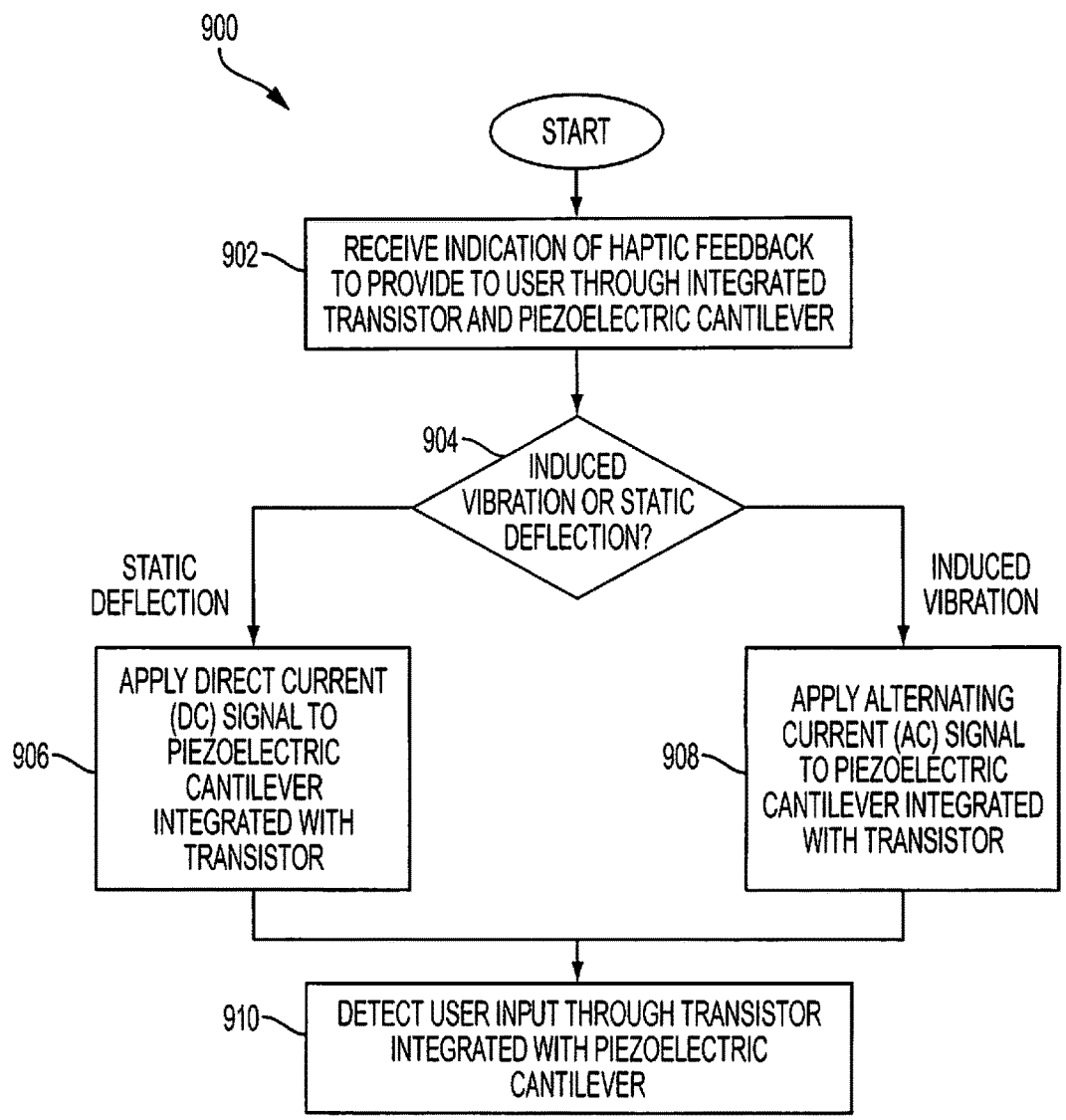
FIG. 9 is a flow chart illustrating a method of providing haptic feedback to a user through a single semiconductor component integrating transistor with cantilever actuator according to one embodiment of the disclosure.

Receiving and processing user input with the single semiconductor component illustrated in FIG. 2 is described above, however the single semiconductor component may also be used to provide feedback to the user. FIG. 9 is a flow chart illustrating a method of providing haptic feedback to a user through a single semiconductor component integrating transistor with cantilever actuator according to one embodiment of the disclosure. A method 900 begins at block 902 with receiving an indication of haptic feedback to provide to the user through the integrated transistor and piezoelectric cantilever. For example, referring to FIG. 3, the processor 330 may receiving instructions from the application 340 to simulate a button on a display device of a smartphone. At block 904, it is determined whether the feedback should be provided through induced vibration or static deflection of the cantilever actuator.

If the feedback is to be provided through static deflection, the method 900 proceeds to block 906 with applying a direct current (DC) signal to the piezoelectric cantilever integrated with the transistor. The DC signal may be applied, for example, through the two electrodes coupled to the cantilever actuator 210 of FIG. 2. If the feedback is to be provided through induced vibration, the method 900 proceeds to block 908 with applying an alternating current (AC) signal to the piezoelectric cantilever integrated with the transistor. The AC signal may likewise be applied to the electrodes of the cantilever actuator 210 of FIG. 2. In one embodiment, feedback may include both static deflection and induced vibration. In this embodiment, the AC signal applied to the piezoelectric cantilever may have a DC bias, such that the DC bias is not zero and the DC bias has the effect of causing static deflection along with the induced vibration.

After feedback is provided at block 906 or block 908, the method 900 may proceed to block 910. At block 910, user input may be received through the transistor integrated with the piezoelectric cantilever. For example, when a physical button is presented on a display device of a smartphone by the cantilever actuator, user input of pressing on the button may be detected through the transistor coupled to the cantilever actuator. In this example, this user input may be received simultaneously with the providing of the haptic feed to the user. Thus, the user input may be received in direct response to the feedback.

Figure 10A:
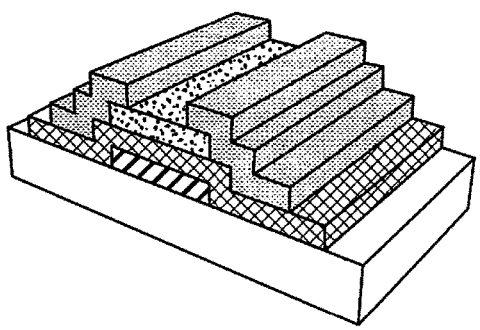
FIGS. 10A-D are illustrations of various configurations for a transistor of a single semiconductor component integrating transistor with cantilever actuator according to certain embodiments of the disclosure.
Figure 10B:
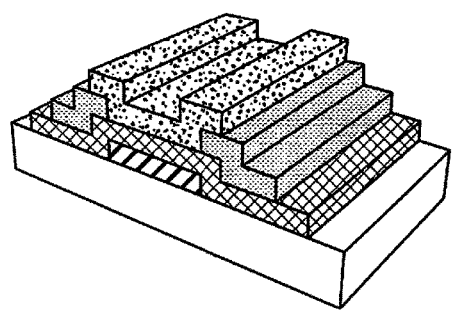
Figure 10C:
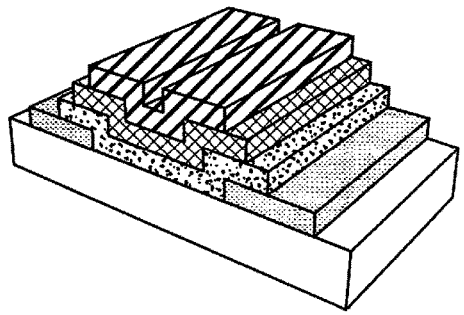
Figure 10D:
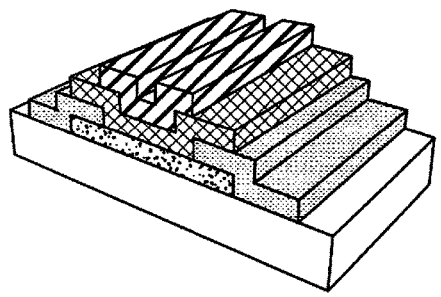

Although a particular transistor structure is illustrated in FIG. 2 and described above, the transistor of the single semiconductor component 200 of FIG. 2 is not restricted to a certain transistor configuration. Other transistor configurations may also be integrated with a cantilever actuator. For example, FIGS. 10A-D are illustrations of various configurations for a transistor of a single semiconductor component integrating transistor with cantilever actuator according to certain embodiments of the disclosure. FIG. 10A illustrates a bottom-gate staggered TFT structure that may be incorporated into the single semiconductor component 200 of FIG. 2 according to one embodiment of the disclosure. FIG. 10B illustrates a bottom-gate coplanar TFT structure that may be incorporated into the single semiconductor component 200 of FIG. 2 according to one embodiment of the disclosure. FIG. 10C illustrates a top-gate staggered TFT structure that may be incorporated into the single semiconductor component 200 of FIG. 2 according to one embodiment of the disclosure. FIG. 10D illustrates a top-gate coplanar TFT structure that may be incorporated into the single semiconductor component 200 of FIG. 2 according to one embodiment of the disclosure.

Figure 11:
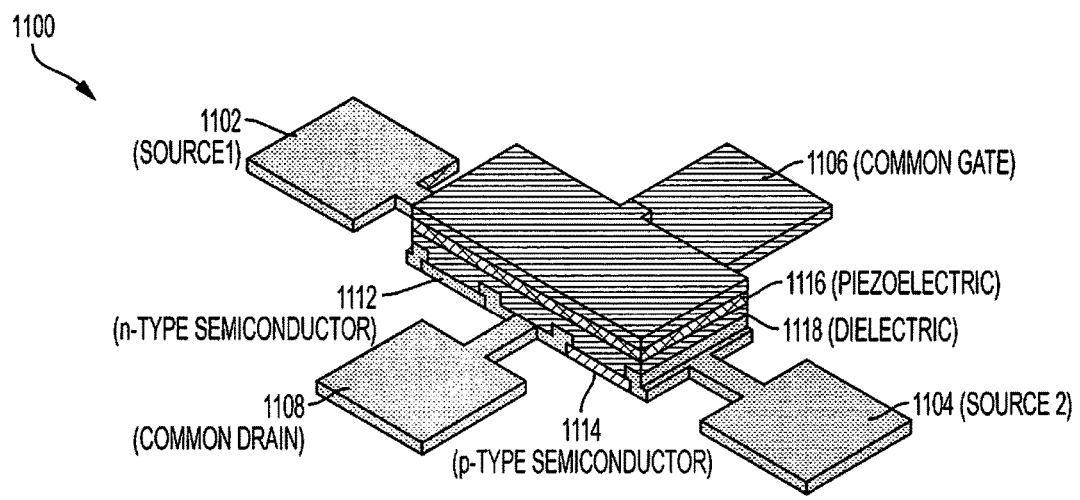
FIG. 11 is an illustration showing a complimentary metal-oxide-semiconductor (CMOS)-like configuration of a single semiconductor component integrating transistor with cantilever actuator according to one embodiment of the disclosure.

Additionally, although a single transistor is shown integrated in the single semiconductor component 200 of FIG. 2 with a cantilever actuator, multiple transistors may be integrated with a piezoelectric material or cantilever actuator, such as in a complimentary metal-oxide-semiconductor (CMOS) configuration. FIG. 11 is an illustration showing a complimentary metal-oxide-semiconductor (CMOS)-like configuration of a single semiconductor component integrating transistor with cantilever actuator according to one embodiment of the disclosure. A single semiconductor component 1100 may include a piezoelectric layer 1116 integrated with a transistor. The transistor may include an n-type semiconductor channel 1112 and a p-type semiconductor channel 1114. Communication with the component 1100 may be through a first source electrode 1102, a second source electrode, 1104, a common gate electrode 1106, and a common drain electrode 1108. A cantilever actuator (not shown) may extend from the common gate electrode 1106 similar to the cantilever actuator 230 of FIG. 2.

When two semiconductors, the n-type 1112 and p-type 1114, are used in the CMOS-like configuration of component 1100, piezoelectric effects such as touch, force, pressure, and/or vibration, along with pyroelectric such as temperature can be detected. If the induced charges due to the piezoelectric effect cause a change in the threshold voltage $V_T$ in the p-type semiconductor 1114, the pyroelectric effect can be detected in the n-type semiconductor 1112. Detection can also occur such that pyroelectric effects are detected through the p-type semiconductor 1114 and the piezoelectric effects are detected through the n-type semiconductor 1112.

The single semiconductor component illustrated in FIG. 2 and the other configurations of the single semiconductor component described above may be manufacturing through novel combinations of conventional thin film processing techniques. In one embodiment, a top gate structure may be fabricated on a rigid glass substrate. A transparent p-type tin monoxide (SnO) semiconductor active layer may be deposited by DC reactive magnetron sputtering. Source and drain electrodes may then be electron-beam evaporated from Titanium and Gold sources. Next, the deposited stack may be annealed after source and drain deposition to crystallize the SnO active layer. Then, a P(VDF-TrFE-CFE) copolymer piezoelectric material powder may be dissolved in Dimethyl Formamide (DMF) to obtain a solution that is filtered and spun on the SnO film followed by a soft bake of the polymer. The films may then be annealed to improve crystallinity. Next, aluminum top gate electrodes may be thermally evaporated to complete the stack. Layers of the device may be patterned by conventional photolithography technique and lift-off process.

Although one particular method of manufacturing is described, many other manufacturing processes can be used to obtain the same or similar configurations of a single semiconductor component with integrated transistor and cantilever actuator. For example, the described process used opaque electrodes, including titanium, gold, and aluminum, but transparent electrodes such as indium tin oxide (ITO), aluminum doped zinc oxide (AZO), graphene, silver nanowires, or any other inorganic or organic available transparent electrodes may be substituted in the process.

If implemented in firmware and/or software, the functions described above, such as with respect to the flow chart of FIG. 5 and FIG. 9 may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically erasable programmable read-only memory (EEPROM), compact-disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks, and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

The invention claimed is:

1. An apparatus, comprising:
   a transistor comprising at least a source electrode, a drain electrode, and a gate electrode; and
   a cantilever actuator comprising a piezoelectric material, wherein the cantilever actuator is electrically isolated but mechanically connected to and integrated with the transistor through the gate electrode of the transistor, wherein the cantilever actuator comprises at least two electrodes separate from the source electrode, the drain electrode, and the gate electrode, wherein the at least two electrodes comprise a first electrode and a second electrode, and wherein the at least two electrodes allow for simultaneous actuating of the cantilever actuator separate from accessing of the transistor through the source electrode, the drain electrode, and the gate electrode.

2. The apparatus of claim 1, further comprising a sensing circuit coupled to at least the source electrode, the drain electrode, and the gate electrode of the transistor, wherein the sensing circuit is configured to detect pressure applied to the cantilever actuator by sensing a change in the threshold voltage of the transistor.

3. The apparatus of claim 2, wherein the piezoelectric material comprises a pyroelectric material, and wherein the sensing circuit is configured to detect a temperature of an environment around the cantilever actuator.

4. The apparatus of claim 1, further comprising a haptic feedback circuit coupled to the at least two electrodes of the cantilever actuator.

5. The apparatus of claim 4, wherein the haptic feedback circuit is configured to generate a direct current (DC) signal or an alternating current (AC) signal to deflect the cantilever actuator.

6. The apparatus of claim 5, wherein the haptic feedback circuit is configured to to generate a direct current (DC) signal and simulate a button raising from a surface.

7. The apparatus of claim 5, wherein the haptic feedback circuit is configured to generate an alternating current (AC) signal and a shake effect.

8. The apparatus of claim 1, wherein the cantilever actuator comprises PVDF and/or the cantilever actuator comprises a load attached at a distal end of the piezoelectric material from the transistor.

9. The apparatus of claim 1, wherein the transistor comprises at least one of a staggered bottom gate thin film transistor (TFT), a coplanar bottom-gate TFT, a staggered top-gate TFT, and a coplanar top-gate TFT.

10. The apparatus of claim 1, wherein the transistor and the cantilever are integrated in a display device, wherein the display device is part of an electronic device comprising at least one of a mobile device, a cellular phone, a laptop, a tablet, a media player, a global positioning system (GPS) device, and an e-book reader.

11. The apparatus of claim 1, wherein the transistor further comprises:
a first semiconductor channel region;
a second semiconductor channel region;
a dielectric layer over the first semiconductor channel region and the second semiconductor channel region; and
a piezoelectric layer over the first semiconductor channel region and the second semiconductor channel region, wherein the gate electrode extends over the first semiconductor channel region and over the second semiconductor channel region.

12. The apparatus of claim 11, wherein the first semiconductor channel region comprises a p-type semiconductor, and where the second semiconductor channel region comprises a n-type semiconductor.

13. The apparatus of claim 12, further comprising:
a first source electrode coupled to the first semiconductor channel region;
a second source electrode coupled to the second semiconductor channel region; and
a drain electrode coupled to the first semiconductor channel region and coupled to the second semiconductor channel region.

14. The apparatus of claim 13, further comprising:
a first sensor circuit coupled to the first source electrode and the drain electrode, wherein the first sensor circuit is configured to measure a piezoelectric effect within the piezoelectric layer; and
a second sensor circuit coupled to the second source electrode and the drain electrode, wherein the second sensor circuit is configured to measure a pyroelectric effect within the piezoelectric layer.

15. An electronic device capable of providing haptic feedback to a user, the electronic device comprising:
an array of haptic feedback devices, wherein at least one haptic feedback device of the array of haptic feedback devices comprises:
a transistor comprising at least a source electrode, a drain electrode, and a gate electrode; and
a cantilever actuator comprising a piezoelectric material,
wherein the cantilever actuator is electrically isolated but mechanically connected to and integrated with the transistor through the gate electrode of the transistor,
wherein the cantilever actuator comprises at least two electrodes separate from the source electrode, the drain electrode, and the gate electrode, wherein the at least two electrodes comprise a first electrode and a second electrode, and
wherein the at least two electrodes allow for simultaneous actuating of the cantilever actuator separate from accessing of the transistor through the source electrode, the drain electrode, and the gate electrode.

16. The haptic feedback-enabled device of claim 15, further comprising a processor coupled to the array of haptic feedback devices, wherein the processor is configured to receive signals from the array of haptic feedback devices and is configured to determine a user input based on the received signals or the processor is configured to determine a haptic feedback sensation to provide to a user and configured to generate signals that when provided to the array of haptic feedback devices cause the user to receive the determined haptic feedback sensation.

17. The haptic feedback-enabled device of claim 15, further comprising a display device, wherein the array of haptic feedback devices is positioned above the display device.

18. A method, comprising:
detecting, through a transistor of a sensor, a change in induced charge of a piezoelectric film indicative of a user input to an electronic device, wherein the piezoelectric film is electrically isolated from the transistor but mechanically connected to the transistor;
determining, by a processor coupled to the transistor, whether a pressure was applied to the sensor based, at least in part, on the change in induced charge, wherein the change in induced charge is determined based, at least in part, on a threshold voltage of a transistor coupled to the piezoelectric film;
processing, by the processor, the user input based, at least in part, on the determined pressure at the sensor; and
performing, by the processor, an operation based, at least in part, on the received user input.

19. The method of claim 18, further comprising outputting a signal to the piezoelectric film of the sensor, wherein the signal induces movement an actuator of the sensor, wherein the signal comprises a direct current (DC) signal selected to move the actuator a determined distance or outputting a signal to the piezoelectric film of the sensor, wherein the signal comprises an alternating current (AC) signal selected to induce vibration in the actuator.

20. The method of claim 18, wherein the step of detecting the change in induced charge and the step of outputting the signal to the piezoelectric film are performed simultaneously.

* * * * *